(12) United States Patent
Chang et al.

(10) Patent No.: US 7,164,177 B2
(45) Date of Patent: Jan. 16, 2007

(54) MULTI-LEVEL MEMORY CELL

(75) Inventors: Ko-Hsing Chang, Hsinchu (TW); Chiu-Tsung Huang, Hsinchu (TW)

(73) Assignee: Powerchip Semiconductor Corp., Hsinchu (TW)

( * ) Notice: Subject to any disclaimer, the term of this patent is extended or adjusted under 35 U.S.C. 154(b) by 73 days.

(21) Appl. No.: 10/707,677

(22) Filed: Jan. 2, 2004

(65) Prior Publication Data

US 2005/0145919 A1   Jul. 7, 2005

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/406; 257/314; 257/321; 257/324; 257/325; 257/333; 257/395; 257/405; 257/411; 257/638

(58) Field of Classification Search ................ 257/314, 257/321, 324–325, 333, 411, 638, 395, 405–406
See application file for complete search history.

(56) References Cited

U.S. PATENT DOCUMENTS

| | | | | |
|---|---|---|---|---|
| 5,293,062 A * | 3/1994 | Nakao | ................... | 257/638 |
| 5,463,235 A * | 10/1995 | Ishii | ................... | 257/300 |
| 5,774,400 A * | 6/1998 | Lancaster et al. | ......... | 365/185.3 |
| 5,917,215 A * | 6/1999 | Chuang et al. | ............. | 257/321 |
| 6,008,091 A * | 12/1999 | Gregor et al. | ............... | 438/261 |
| 6,124,153 A * | 9/2000 | Lee et al. | ................... | 438/151 |
| 6,137,718 A * | 10/2000 | Reisinger | ............... | 365/185.03 |
| 6,225,669 B1 * | 5/2001 | Long et al. | .................. | 257/401 |
| 6,265,268 B1 * | 7/2001 | Halliyal et al. | ............. | 438/261 |
| 6,649,972 B1 * | 11/2003 | Eitan | .......................... | 257/324 |
| 6,735,123 B1 * | 5/2004 | Tripsas et al. | .......... | 365/185.26 |
| 6,740,605 B1 * | 5/2004 | Shiraiwa et al. | ............ | 438/795 |
| 6,750,102 B1 * | 6/2004 | Lancaster | ................... | 438/261 |
| 6,784,055 B1 * | 8/2004 | Shin et al. | .................. | 438/257 |
| 6,858,906 B1 * | 2/2005 | Lee et al. | ................... | 257/406 |
| 2002/0179958 A1 * | 12/2002 | Kim | .......................... | 257/314 |
| 2003/0042558 A1 * | 3/2003 | Noguchi et al. | ............ | 257/406 |
| 2003/0203560 A1 * | 10/2003 | Ryu et al. | ................. | 438/218 |
| 2003/0211689 A1 * | 11/2003 | Yoo et al. | ................... | 438/257 |
| 2003/0218205 A1 * | 11/2003 | Takamura | ................... | 257/315 |
| 2004/0067629 A1 * | 4/2004 | Beaman | ..................... | 438/586 |
| 2004/0105313 A1 * | 6/2004 | Lin et al. | ............... | 365/185.29 |
| 2004/0202032 A1 * | 10/2004 | Forbes | ........................ | 365/200 |
| 2005/0073886 A1 * | 4/2005 | Hamilton et al. | ...... | 365/185.29 |

* cited by examiner

*Primary Examiner*—Ida M. Soward
(74) *Attorney, Agent, or Firm*—Jiang Chyun IP Office

(57) ABSTRACT

A multi-level memory cell including a substrate, a tunneling dielectric layer, a charge-trapping layer, a top dielectric layer, a gate and a pair of source/drain regions is provided. The tunneling dielectric layer, the charge-trapping layer and the top dielectric layer are sequentially formed between the substrate and the gate. The top dielectric layer has at least two portions, and the top dielectric layer in each portion has a different thickness. The source/drain regions are disposed in the substrate on each side of the gate. Since the thickness of the top dielectric layer in each portion is different, the electric field strength between the gate and the substrate when a voltage is applied to the memory cell are different in each portion. With the number of charges trapped within the charge-trapping layer different in each portion, a multiple of data bits can be stored within each memory cell.

9 Claims, 3 Drawing Sheets

MULTI-LEVEL MEMORY CELL

BACKGROUND OF INVENTION

1. Field of the Invention

The present invention relates to a semiconductor device. More particularly, the present invention relates to a multi-level memory cell.

2. Description of the Related Art

Electrically erasable programmable read-only memory (EEPROM) is a type data storage device that allows multiple data writing, reading and erasing operations. In addition, the stored data will be retained even after power to the device is removed. With these advantages, it has been broadly applied in personal computers and electronic equipment.

A typical EEPROM has a floating gate and a control gate fabricated using doped polysilicon. When electrons are injected into the floating gate during a programming operation, the electrons distribute evenly within the polysilicon floating gate layer. However, if the tunneling oxide layer underneath the polysilicon floating gate layer contains some defects, a leakage current may flow from the device and compromise the reliability of the device.

To prevent the flow of a leakage current, an EEPROM with a stacked gate structure having an oxide/nitride/oxide (ONO) composite layer known as a SONOS read-only memory is currently used. Here, the silicon nitride layer replaces the polysilicon floating gate as the charge-trapping layer. Because electrons are injected into the silicon nitride layer mainly through a localized region, the leakage current is less sensitive to any defects in the tunneling oxide layer.

FIG. 1 is a schematic cross-sectional view of a conventional SONOS read-only memory (ROM) cell. As shown in FIG. 1, the SONOS ROM cell includes a substrate 100, a composite layer 114 that includes a silicon oxide layer 102, a silicon nitride layer 104 and a silicon oxide layer 106 (ONO), a gate 108, a pair of spacers 110, a channel 118 and a pair of source/drain regions 112. The silicon oxide layer 102, the silicon nitride layer 104 and the silicon oxide layer 106 constituting the composite layer 114 are sequentially formed over the substrate 100. The gate 108 is formed over the composite layer 114. The gate 108 and the composite layer 114 together form a gate structure 116. The spacers 110 are positioned on the sidewalls of the gate structure 116. The source/drain regions 112 are formed in the substrate 100 on each side of the gate structure 116. The channel 118 is formed in an area underneath the silicon oxide layer 102 between the source/drain region 112.

To program data into the aforementioned SONOS ROM cells, the so-called Fowler-Nordheim tunneling effect is utilized. First, a voltage is applied to the gate 108 so that a large electric field is setup between the gate 108 and the substrate 100. The electric field induces the electrons in the substrate 100 to inject from the channel 118 through the tunneling dielectric layer 102 into the charge-trapping layer 104, thereby increasing the threshold voltage of the transistor. In this way, a single bit of data is programmed into a memory cell.

In a conventional SONOS ROM, a single bit of data is stored within each memory cell. However, with the expansion of computer software applications, the need for high storage capacity memory increases exponentially. To produce a deep sub-micron memory with a large memory capacity, the structure and some of the steps for forming the SONOS ROM must somehow be modified.

SUMMARY OF INVENTION

Accordingly, at least one objective of the present invention is to provide a multi-level memory cell with a larger memory capacity.

To achieve these and other advantages and in accordance with the purpose of the invention, as embodied and broadly described herein, the invention provides a multi-level memory cell. The multi-level memory cell includes a substrate, a tunneling dielectric layer, a charge-trapping layer, a top dielectric layer, a gate and a pair of source/drain regions. The tunneling dielectric layer, the charge-trapping layer and the top dielectric layer made from silicon oxide, silicon nitride and silicon oxide material respectively are sequentially formed over the substrate. The tunneling dielectric layer has a thickness between 20 Å to 40 Å so that charges may tunnel from the substrate into the charge-trapping layer through the Fowler-Nordheim tunneling effect. The charge-trapping layer has a thickness between 40 Å to 60 Å for capturing and holding charges.

The top dielectric layer has at least two portions with each portion having a different thickness. When a voltage is applied to the gate, different electric field strength is set up between the gate and the substrate in each portion. With different electric field strength in each portion, the amount of charges that can be accommodated within the charge-trapping layer will be different. Therefore, a single memory cell can register multiple data bits.

In addition, the tunneling dielectric layer, the charge-trapping layer and the top dielectric together with the gate form a gate structure. Furthermore, spacers are formed on the sidewalls of the gate structure. The spacers are fabricated using an insulating material such as silicon oxide. The source/drain regions are formed in the substrate on each side of the gate structure.

With the top dielectric layer of the multi-level memory cell hsa at least two portions, the amount of charges stored in the charge-trapping layer of each portion is different. Hence, each memory cell can be activated by a group of different threshold voltage values so that multiple data bits are registered. In other words, the storage capacity of each memory cell is increased.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
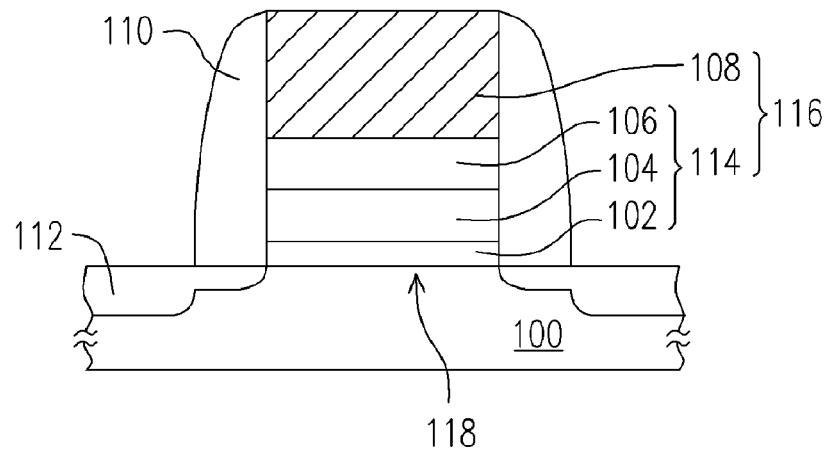
FIG. 1 is a schematic cross-sectional view of a conventional SONOS read-only memory (ROM) cell.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
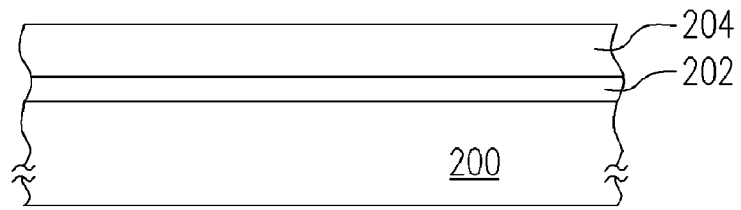
FIGS. 2A through 2F are schematic cross-sectional views showing the steps for fabricating a multi-level memory cell according to one preferred embodiment of this invention.

FIGS. 2A through 2F are schematic cross-sectional views showing the steps for fabricating a multi-level memory cell according to one preferred embodiment of this invention. As shown in FIG. 2A, a substrate 200 such as a P-type semiconductor substrate is provided. A tunneling dielectric layer 202 having a thickness between 20 Å to 40 Å is formed over the substrate 200. The tunneling dielectric layer 202 is a silicon oxide layer formed, for example, by performing a chemical vapor deposition process. Since the tunneling dielectric layer 202 is fabricated using silicon oxide material, the tunneling dielectric layer 202 is also referred to as a bottom oxide layer. Thereafter, a charge-trapping layer 204 having a thickness between 40 Å to 60 Å is formed over the tunneling dielectric layer 202, for example, by performing a chemical vapor deposition process. The charge-trapping layer 204 is fabricated using silicon nitride or other materials that have a charge trapping capability.

Figure 2B:
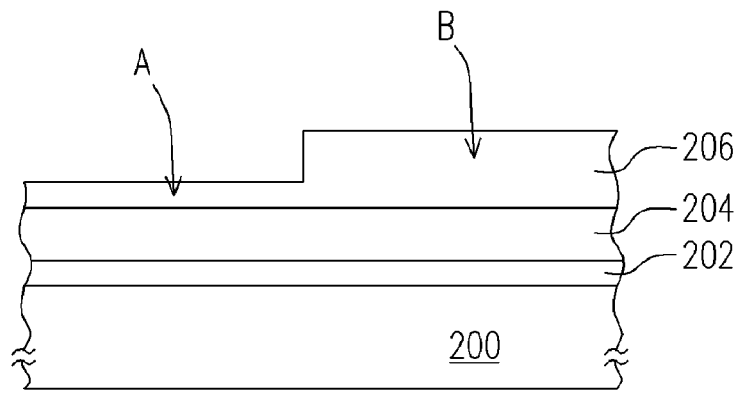

As shown in FIG. 2B, a top dielectric layer 206 is formed over the charge-trapping layer 204, for example, by performing a chemical vapor deposition process using silicon oxide. Since the top dielectric layer 206 is fabricated using silicon oxide as material, the top dielectric layer 206 is also referred to as a top oxide layer. The top dielectric layer 206 is divided into a plurality of portions. Two portions labeled A and B are shown in FIG. 2B. Thereafter, a etching back process or a repetition of the chemical vapor deposition process is carried out so that the top dielectric layer 206 has different thickness in portion A and portion B.

Figure 2C:
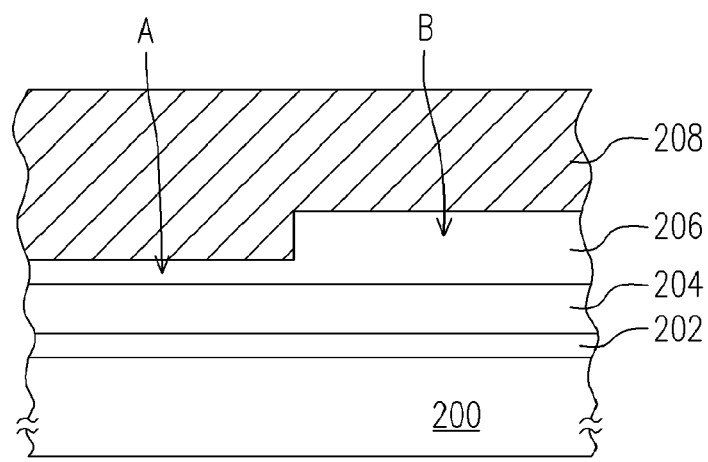

As shown in FIG. 2C, a doped polysilicon layer 208 is formed over the top dielectric layer 206. The doped polysilicon layer 208 is formed, for example, by performing a chemical vapor deposition process to form a polysilicon layer (not shown) over the top dielectric layer 206 and then implanting dopants into the polysilicon layer. Alternatively, the dopants are added in-situ with the polysilicon deposition. In general, P-type or N-type dopants may be implanted according to the particular fabrication process.

Figure 2D:
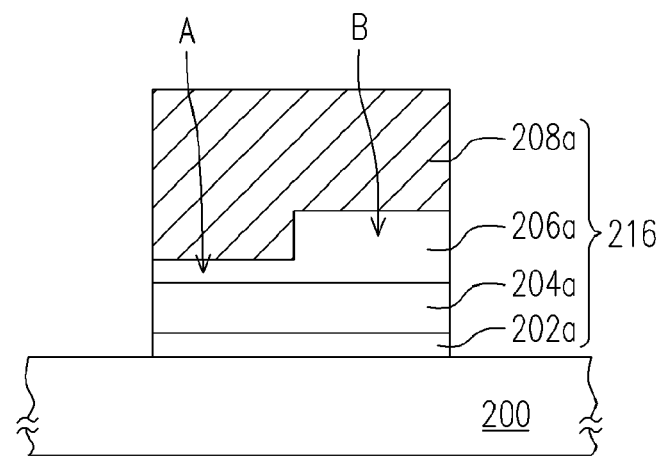

As shown in FIG. 2D, a photolithographic and etching process is carried out to pattern out a gate structure 216. The gate structure 216 includes a patterned tunneling dielectric layer 202a, a charge-trapping layer 204a, a top dielectric layer 206a and a gate 208a. The top dielectric layer 206a includes the portions A and B. Furthermore, the top dielectric layer 206a has a different thickness in portion A and B. In other words, the top dielectric layer 206a has parts with different thickness.

Figure 2E:
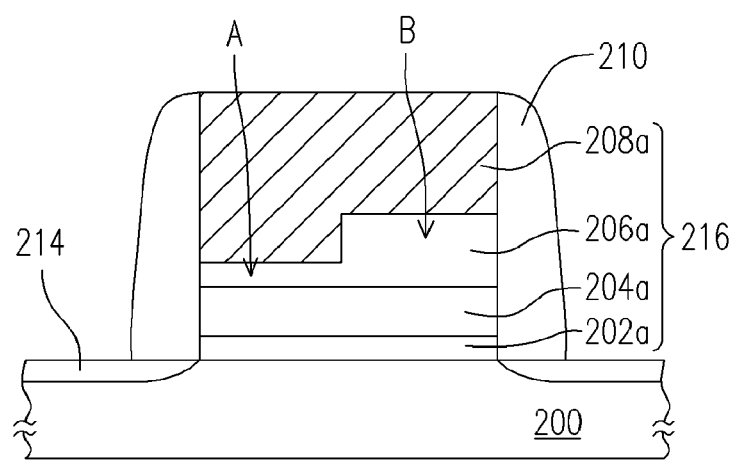

As shown in FIG. 2E, an ion implantation is carried out using the gate structure 216 as a mask to form lightly doped regions 214 in the substrate 200. Thereafter, spacers 210 are formed on the sidewalls of the gate structure 216. The spacers 210 are silicon oxide layers formed, for example, by performing a chemical vapor deposition process to form a conformal silicon oxide layer (not shown) over the substrate 200 and covering the gate structure 216 and then performing an anisotropic etching operation.

Figure 2F:
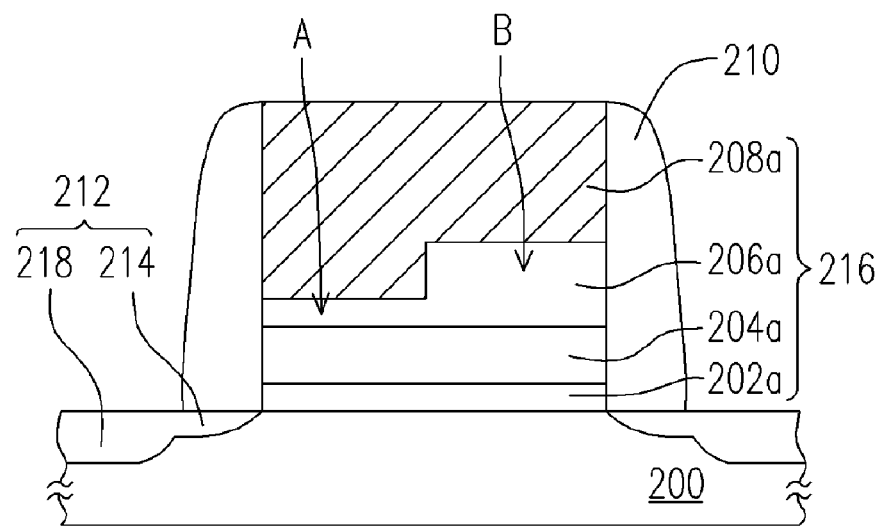

As shown in FIG. 2F, a doping operation is carried out using the spacers 210 as a mask to form heavily doped regions 218 in the substrate 200. Thus, a multi-level memory cell is formed. The heavily doped region 218 and the lightly doped region 214 together constitute a source/drain region 212. The doping operation includes an ion implantation, for example.

FIG. 2F shows a fully formed multi-level memory cell according to this invention. As shown in FIG. 2F, the multi-level memory cell includes a substrate 200, a tunneling dielectric layer 202a, a charge-trapping layer 204a, a top dielectric layer 206a, a gate 208a, a pair of spacers 210 and a pair of source/drain regions 212. The tunneling dielectric layer 202a, the charge-trapping layer 204a and the top dielectric layer 206a made from silicon oxide, silicon nitride and silicon oxide material respectively are sequentially formed over the substrate 200. The tunneling dielectric layer 202a has a thickness between 20 Å to 40 Å. The tunneling dielectric layer 202a is a layer that facilitates the tunneling of charges from the substrate 200 into the charge-trapping layer 204a through the Fowler-Nordheim tunneling effect. The charge-trapping layer 204a having a thickness between 40 Å to 60 Å is used for capturing and holding electric charges.

In addition, the tunneling dielectric layer 202a, the charge-trapping layer 204a and the top dielectric layer 206a together constitute a gate structure 216. The spacers 210 are formed on the sidewalls of the gate structure 216. The spacers 210 are fabricated using an insulating material including silicon oxide, for example. The source/drain regions 212 are located in the substrate 200 on each side of the gate structure 216.

Note that the top dielectric layer 206a is divided into portion A and portion B. Since the top dielectric layer 206a in portion A has a thickness that differs from the one in portion B, the electric field strength between the gate 208a and the substrate 200 are different in these two portions. Hence, the electric field strength inside the charge-trapping layer 204a is different due to a different thickness in the top dielectric layer 206a between these two portions. When the memory cell is activated, charges are injected from the substrate 200 into the charge-trapping layer 204a via the tunneling dielectric layer 202a due to the Fowler-Nordheim effect. The injected charges are retained within the charge-trapping layer 204a. Furthermore, the amount of charges injected into the charge-trapping layer 204a is related to the electric field strength. In other words, during the memory programming operation, the electric field strength between the gate 208a and the substrate 200 in the portion with a thinner top dielectric layer 206a is greater. Therefore, more charges will tunnel through the tunneling dielectric layer 202a into the charge-trapping layer 204a. Conversely, the electric field strength between the gate 208a and the substrate 200 in the portion with a thicker top dielectric layer 206a is smaller. Therefore, less charges will tunnel through the tunneling dielectric layer 202a into the charge-trapping layer 204a. Consequently, the amount of charges trapped within the charge-trapping layer of each portion is different so that a single memory cell can hold a multiple of data bits.

Because the amount of charges trapped in the charge-trapping layer in portion A and portion B is different in this embodiment, two different threshold voltages can be used to activate a single memory cell.

Note that the top dielectric layer inside each multi-level memory cell according to this invention can be divided into a multiple of portions. Although the aforementioned embodiment has two portions with different thickness, there is no restriction on the number of portions in the top dielectric layer.

Figure 3:
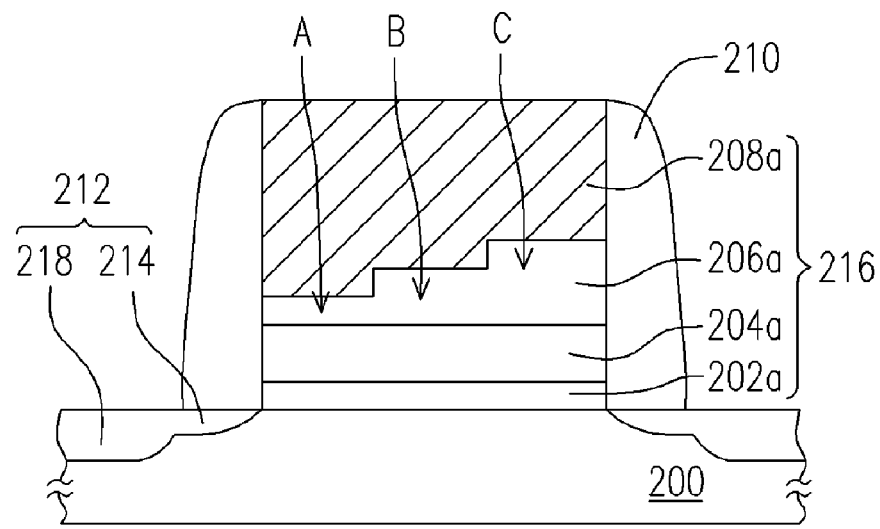
FIG. 3 is a schematic cross-sectional view of a multi-level memory cell according to another preferred embodiment of this invention.

FIG. 3 is a schematic cross-sectional view of a multi-level memory cell according to another preferred embodiment of this invention. All the elements in FIG. 3 identical to the aforementioned embodiment are labeled identically. Since the materials and method of fabrication are mostly identical to the aforementioned embodiment, detailed description is omitted. In this embodiment, the top dielectric layer 206a has three portions A, B and C with the top dielectric layer 206a inside each portion having a different thickness. When a voltage is applied to the gate, the electric field strength between the gate and the substrate corresponding to the portion A, B and C are all different. Thus, the amount of charges trapped within the charge-trapping layer in each portion is different. In this embodiment, three different threshold voltages can be used to activate a single memory cell. Therefore, the storage capacity of each memory cell is further increased.

With the top dielectric layer of the multi-level memory cell has at least two portions, the amount of charges stored in the charge-trapping layer of each portion is different. Hence, each memory cell can be activated by a group of different threshold voltage values so that multiple data bits are registered. In other words, the storage capacity of each memory cell is increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

The invention claimed is:

1. A multi-level memory cell, comprising:
   a substrate;
   a gate disposed over the substrate;
   a source region and a drain region configured in the substrate on each side of the gate;
   a tunneling dielectric layer disposed between the gate and the substrate;
   a charge-trapping layer disposed between the tunneling dielectric layer and the gate; and
   a top dielectric layer disposed between the charge-trapping layer and the gate, wherein the top dielectric layer has at least two portions from the source region to the drain region, and the portions adjacent to the source region has a different thickness to that of the portion adjacent to the drain region, and wherein the tunneling dielectric layer has substantially a same thickness from the source region to the drain region.

2. The multi-level memory cell of claim 1, wherein a material constituting the charge-trapping layer comprises silicon nitride.

3. The multi-level memory cell of claim 1, wherein the cell further comprises a pair of spacers disposed on each sidewall of the gate.

4. The multi-level memory cell of claim 3, wherein the cell further comprises lightly doped regions configured in the substrate underneath the spacers.

5. The multi-level memory cell of claim 3, wherein a material constituting the spacers comprises silicon oxide.

6. The multi-level memory cell of claim 1, wherein the tunneling dielectric layer has a thickness between about 20 Å to 40 Å.

7. The multi-level memory cell of claim 1, wherein the charge-trapping layer has a thickness between about 40 Å to 60 Å.

8. The multi-level memory cell of claim 1, wherein a material constituting the tunneling dielectric layer comprises silicon oxide.

9. The multilevel memory cell of claim 1, wherein a material constituting the top dielectric layer comprises silicon oxide.

* * * * *